(12) United States Patent
Arkiszewski et al.

(10) Patent No.: US 10,615,758 B2
(45) Date of Patent: *Apr. 7, 2020

(54) MULTI-MODE POWER AMPLIFIER MODULE

(71) Applicant: SKYWORKS SOLUTIONS, INC., Woburn, MA (US)

(72) Inventors: Roman Zbigniew Arkiszewski, Oak Ridge, NC (US); Onder Oz, Santa Clara, CA (US); Jianxing Ni, San Jose, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/820,145

(22) Filed: Nov. 21, 2017

(65) Prior Publication Data
US 2018/0226927 A1    Aug. 9, 2018

Related U.S. Application Data

(63) Continuation of application No. 15/393,692, filed on Dec. 29, 2016, now Pat. No. 9,837,972.
(Continued)

(51) Int. Cl.
*H03F 3/193* (2006.01)
*H03F 3/24* (2006.01)
(Continued)

(52) U.S. Cl.
CPC ........... *H03F 3/245* (2013.01); *H03F 1/0277* (2013.01); *H03F 1/56* (2013.01); *H03F 3/193* (2013.01);
(Continued)

(58) Field of Classification Search
CPC .... H03F 3/245; H03F 3/193; H03F 2200/387; H03F 2200/451; H04W 88/06
(Continued)

(56) References Cited

U.S. PATENT DOCUMENTS

| 6,111,459 A * | 8/2000 | Nishijima | ............... H03F 3/602 330/124 D |
| 6,208,875 B1 * | 3/2001 | Damgaard | ............... H03L 7/23 455/260 |

(Continued)

*Primary Examiner* — Hai V Nguyen
(74) *Attorney, Agent, or Firm* — Knobbe, Martens, Olson & Bear, LLP (57) ABSTRACT

A power amplifier that can support multiple communication networks while maintaining power efficiency across each of the supported communication networks is disclosed. In some implementations described herein, a power amplifier module includes a bypass circuit that enables different voltage supplies to be provided to the power amplifier. By regulating the voltage supply provided to the power amplifier, the power amplifier can support different communication networks while maintaining power efficiency across a dynamic frequency range. Moreover, embodiments herein may include a buck converter, or other form of DC-DC converter, that enables the power amplifier to operate with respect to multiple communication networks. Advantageously, in certain embodiments, because wireless devices that include multiple power amplifiers often require a DC-DC converter to support at least some of the communication networks, the inclusion of the buck converter in the embodiments described herein does not add additional cost or size to the wireless device.

20 Claims, 8 Drawing Sheets

Related U.S. Application Data (60) Provisional application No. 62/272,963, filed on Dec. 30, 2015.

(51) Int. Cl.
| | |
|---|---|
| *H03F 3/68* | (2006.01) |
| *H03F 3/72* | (2006.01) |
| *H03F 1/56* | (2006.01) |
| *H03F 1/02* | (2006.01) |
| *H04W 88/06* | (2009.01) |

(52) U.S. Cl.
CPC ............ *H03F 3/68* (2013.01); *H03F 3/72* (2013.01); *H03F 2200/387* (2013.01); *H03F 2200/408* (2013.01); *H03F 2200/451* (2013.01); *H03F 2200/507* (2013.01); *H03F 2203/7209* (2013.01); *H03F 2203/7227* (2013.01); *H03F 2203/7236* (2013.01); *H04W 88/06* (2013.01)

(58) Field of Classification Search
USPC .................................................. 455/552.1
See application file for complete search history.

(56) References Cited

U.S. PATENT DOCUMENTS

| | | | | |
|---|---|---|---|---|
| 6,313,699 B1* | 11/2001 | Nishijima | ............... | H03F 3/602 330/129 |
| 6,313,700 B1* | 11/2001 | Nishijima | ............... | H03F 3/602 330/124 D |
| 6,489,843 B1* | 12/2002 | Nishijima | ............... | H03F 3/602 330/128 |
| 6,766,178 B1* | 7/2004 | Damgaard | ................ | H03L 7/23 455/216 |
| 7,529,069 B1* | 5/2009 | Weems, II | ............ | G01R 31/025 361/42 |
| 8,089,253 B2* | 1/2012 | Murtojarvi | ............. | H03F 1/0211 323/224 |
| 8,190,174 B2* | 5/2012 | Hao | ........................ | H04L 67/18 455/456.2 |
| 8,289,084 B2* | 10/2012 | Morimoto | ............. | H03F 1/0216 330/296 |
| 8,618,876 B2* | 12/2013 | Deng | .................... | H03F 1/0261 330/285 |
| 8,633,766 B2* | 1/2014 | Khlat | ...................... | H02M 3/07 323/222 |
| 8,639,200 B2* | 1/2014 | Dagher | ................. | H04W 52/52 455/127.1 |
| 8,699,973 B2* | 4/2014 | Southcombe | ......... | H03F 1/0227 375/297 |
| 8,706,063 B2* | 4/2014 | Honjo | .................... | H03F 1/0227 455/108 |
| 9,030,256 B2* | 5/2015 | Jones | .................... | H03F 1/0227 330/127 |
| 9,071,975 B2* | 6/2015 | Lum | ...................... | H04W 16/14 |
| 9,590,496 B2* | 3/2017 | Yeon | ....................... | H02M 1/44 |
| 9,674,811 B2* | 6/2017 | Eitan | ..................... | G01S 5/0231 |
| 9,837,972 B2* | 12/2017 | Arkiszewski | ............ | H03F 3/245 |
| 2002/0183024 A1* | 12/2002 | Yamaguchi | .......... | H03G 3/3042 455/127.1 |
| 2004/0263246 A1* | 12/2004 | Robinson | ............... | H03F 1/0244 330/124 R |
| 2006/0163349 A1* | 7/2006 | Neugebauer | ......... | G06Q 20/387 235/383 |
| 2006/0202889 A1* | 9/2006 | Oh | ........................ | H03F 1/0233 342/359 |
| 2008/0153508 A1* | 6/2008 | Hao | ........................ | H04L 67/18 455/456.2 |
| 2008/0220826 A1* | 9/2008 | Dagher | ................. | H04W 52/52 455/572 |
| 2008/0278136 A1* | 11/2008 | Murtojarvi | ............ | H03F 1/0211 323/299 |
| 2009/0224834 A1* | 9/2009 | Young | ..................... | H02M 3/07 330/296 |
| 2010/0128689 A1* | 5/2010 | Yoon | .................. | H04W 72/1231 370/329 |
| 2010/0148745 A1* | 6/2010 | Kanou | ................... | H03F 1/0266 323/318 |
| 2011/0298545 A1* | 12/2011 | Morimoto | ............. | H03F 1/0216 330/296 |
| 2012/0146731 A1* | 6/2012 | Khesbak | ............... | H03F 1/0222 330/295 |
| 2012/0161877 A1* | 6/2012 | Southcombe | ......... | H03F 1/0227 330/296 |
| 2012/0212293 A1* | 8/2012 | Khlat | .................... | H03F 1/0227 330/127 |
| 2012/0229210 A1* | 9/2012 | Jones | .................... | H03F 1/0227 330/250 |
| 2012/0236958 A1* | 9/2012 | Deng | .................... | H03F 1/0261 375/295 |
| 2012/0293253 A1* | 11/2012 | Khlat | .................... | H03F 1/0244 330/127 |
| 2012/0299647 A1* | 11/2012 | Honjo | ................... | H03F 1/0227 330/127 |
| 2012/0313701 A1* | 12/2012 | Khlat | ...................... | H02M 3/07 330/127 |
| 2013/0065541 A1* | 3/2013 | Lum | ...................... | H04W 16/14 455/77 |
| 2013/0147445 A1* | 6/2013 | Levesque | ................ | G05F 1/595 323/271 |
| 2013/0212168 A1* | 8/2013 | Bonasera | ............ | G06F 19/3418 709/203 |
| 2013/0279370 A1* | 10/2013 | Eitan | ..................... | G01S 5/0231 370/254 |
| 2014/0009227 A1* | 1/2014 | Kay | ....................... | H03F 1/0244 330/127 |
| 2014/0057684 A1* | 2/2014 | Khlat | .................. | H04W 52/0209 455/574 |
| 2015/0364996 A1* | 12/2015 | Mansri | .................. | H02M 3/158 323/271 |
| 2016/0094254 A1* | 3/2016 | Ripley | ................. | H04B 1/0475 455/114.3 |
| 2017/0077817 A1* | 3/2017 | Houston | ............. | H02M 3/1582 |
| 2017/0194921 A1* | 7/2017 | Arkiszewski | ........... | H03F 3/245 |

\* cited by examiner

MULTI-MODE POWER AMPLIFIER MODULE

RELATED APPLICATIONS

This disclosure claims priority to and is a continuation of U.S. application Ser. No. 15/393,692, which was filed on Dec. 29, 2016 and is titled "MULTI-MODE POWER AMPLIFIER MODULE," the disclosure of which is expressly incorporated by reference herein in its entirety for all purposes, and which claims priority to U.S. Provisional Application No. 62/272,963, which was filed on Dec. 30, 2015 and is titled "MULTI-MODE POWER AMPLIFIER MODULE," the disclosure of which is expressly incorporated by reference herein in its entirety for all purposes. Any and all applications, if any, for which a foreign or domestic priority claim is identified in the Application Data Sheet of the present application are hereby incorporated by reference in their entireties under 37 CFR 1.57.

BACKGROUND

Technical Field

This disclosure relates to a power amplifier module. More specifically, this disclosure relates to a multi-mode power amplifier module.

Description of Related Technology

Wireless devices, such as cellphones, typically use one or more power amplifiers to amplify an information signal prior to transmission. Often, a wireless device will include a plurality of power amplifiers to support a plurality of communication modes. There is a tension between supporting more communication modes and services, and reducing the cost and size of the wireless device. The more communication modes supported, the more space required by the wireless device to support the communication components, including the power amplifier.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a power amplifier module. The power amplifier module may include a first power amplifier configured to process frequencies associated with a first communication band and a bypass switch in communication with the first power amplifier. The bypass switch may be configured to provide a supply voltage to the first power amplifier. This supply voltage may be selected from a plurality of supply voltages based at least in part on a selected communication network. At least one of the supply voltages from the plurality of supply voltages may enable the first power amplifier to process frequencies associated with a second communication.

In certain embodiments, the plurality of supply voltages includes a battery supply voltage and a buck-converter supply voltage. Further, the bypass switch may include a p-channel field effect transistor in communication with a battery supply voltage. In addition, the bypass switch may include a p-channel field effect transistor and an n-channel field effect transistor in communication with a buck-converter supply voltage.

Some implementations of the power amplifier module may further include a second power amplifier in communication with a battery supply voltage without being in communication with the bypass switch. The second power amplifier may be configured to process frequencies associated with 2G communication of a different frequency band than the frequencies processed by the first power amplifier. In some cases, the first communication band is a 2G communication band and the second communication band is a non-2G communication band.

Certain aspects of the present disclosure relate to a front-end module. The front-end module may include a power amplifier module that includes a first power amplifier and a bypass switch in communication with the first power amplifier. The first power amplifier may be configured to process a frequency associated with a first communication band. The bypass switch may be configured to provide a supply voltage to the first power amplifier. The supply voltage may be selected from a plurality of supply voltages based at least in part on a selected communication network. At least one of the supply voltages from the plurality of supply voltages may enable the power amplifier to process a frequency associated with a second communication band. Further, the front-end module may include a direct current-direct current converter in communication with the power amplifier module. The direct current-direct current converter may be configured to provide at least one supply voltage from the plurality of supply voltages to the bypass switch.

In certain embodiments, the direct current-direct current converter includes a buck converter. Moreover, the front-end module may further include an inductor-capacitor circuit between the direct current-direct current converter and the bypass switch. In some cases, the plurality of supply voltages includes a battery supply voltage and a buck-converter supply voltage. Further, the bypass switch may include a p-channel field effect transistor in communication with a battery supply voltage. In some cases, the bypass switch may include a p-channel field effect transistor and an n-channel field effect transistor in communication with a buck-converter supply voltage.

With some implementations of the front-end module, the power amplifier module further includes a second power amplifier in direct communication with a battery supply voltage. Further, the second power amplifier may be configured to process a different frequency associated with 2G communication than the frequency processed by the first power amplifier.

Certain aspects of the present disclosure relate to a wireless device. The wireless device may include an antenna and a front-end module. The antenna may be configured to transmit a signal from the front-end module. The front-end module may include a power amplifier module and a direct current-direct current converter in communication with the power amplifier module. The power amplifier module may include a first power amplifier and a bypass switch in communication with the first power amplifier via a first communication path. The power amplifier may be configured to process a frequency associated with a first communication network. Further, the bypass switch may be configured to provide a supply voltage to the first power amplifier. The supply voltage may be selected from a plurality of supply voltages based at least in part on a selected communication network from a plurality of communication networks. At least one of the supply voltages from the plurality of supply voltages may enable the first power amplifier to process a frequency associated with a second communication network. The direct current-direct current converter may be configured to provide at least one supply voltage from the plurality of supply voltages to the bypass switch.

In certain embodiments, the bypass switch includes a single transistor in communication with a battery supply voltage. In some implementations, the bypass switch includes a pair of transistors in communication with a direct current-direct current converter supply voltage. In some cases, a first transistor of the pair of transistors is a p-channel transistor and the second transistor of the pair of transistors is an n-channel transistor. Further, the power amplifier module may further include a second power amplifier in communication with a battery supply voltage via a second communication path. The second power amplifier may be configured to process a different frequency associated with the first communication network than the frequency processed by the first power amplifier.

DETAILED DESCRIPTION

Introduction

It is typically desirable to design wireless or mobile devices to support multiple communication standards, networks or technologies. For example, wireless devices may be designed to support 2G, 2.5G, 3G, 4G, 4G LTE, 5G, WiMAX, GSM, CDMA, etc. One reason for supporting multiple communication networks is to enable the wireless device to be used in different geographic locations or with different service providers. However, in order to support multiple communication networks, it is often necessary for the wireless device to include multiple power amplifiers. In some implementations, a separate power amplifier may be included for each supported communication network, and in some cases multiple power amplifiers may be included for a supported communication network. For example, some devices may include two or three power amplifiers to support 2G communication, another power amplifier to support 3G communication, and an additional power amplifier to support 4G and/or 4G LTE communication. The inclusion of multiple power amplifiers results in larger, more complex, and more expensive devices.

One solution is to include a power amplifier in the wireless device that is capable of supporting multiple communication networks. However, different communication networks require the power amplifier to support different power ranges. Thus, the voltage supply provided to the power amplifier should be high enough to support each of the communication networks supported by the wireless device. For example, for wireless devices that support 2G, 3G, and 4G communication, the power amplifier receives a voltage equivalent to the battery supply of the wireless device because, typically, 2G communication requires a higher power level than 3G and 4G communication. Consequently, the power efficiency of the power amplifier is reduced compared to devices that include separate power amplifiers when supporting 3G and 4G communication, which typically require lower power than 2G communication.

In certain embodiments described herein, a power amplifier that can support multiple communication networks while maintaining power efficiency across each of the supported communication networks is disclosed. In some implementations described herein, a power amplifier module includes a bypass circuit that enables different voltage supplies to be provided to the power amplifier. By regulating the voltage supply provided to the power amplifier, the power amplifier can support different communication networks while maintaining power efficiency across a dynamic frequency range. Moreover, embodiments herein may include a buck converter, or other form of DC-DC converter, that enables the power amplifier to operate with respect to multiple communication networks. Advantageously, in certain embodiments, because wireless devices that include multiple power amplifiers often require a DC-DC converter to support at least some of the communication networks, the inclusion of the buck converter in the embodiments described herein does not add additional cost or size to the wireless device. Further, some embodiments disclosed herein support time-division long term evolution (TD-LTE) while reducing the size and power requirements of the wireless device compared to systems that do not include multi-mode power amplifiers. Moreover, some embodiments disclosed herein can support time-division-code division multiple access (TD-CDMA).

Example Front-End Module

Figure 1:
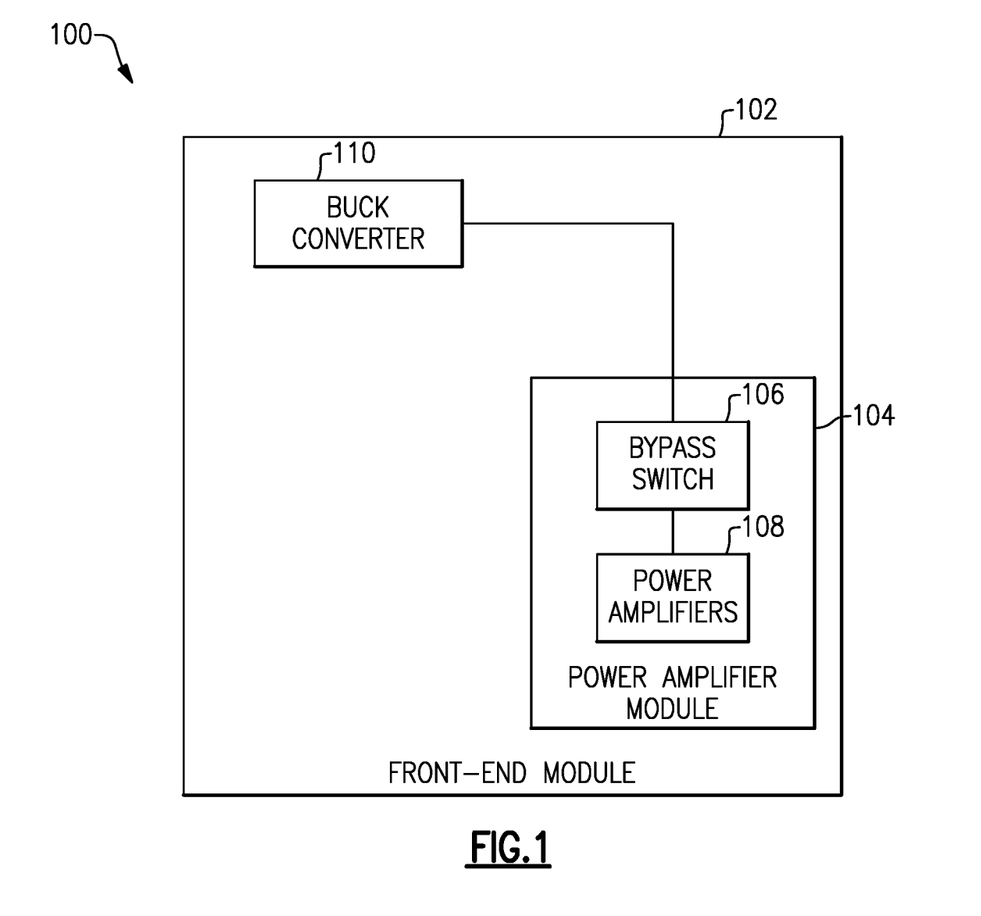
FIG. 1 illustrates a block diagram of an embodiment of a front-end module.

FIG. 1 illustrates a block diagram 100 of an embodiment of a front-end module (FEM) 102. The FEM 102 may be part of a transmission path that is in communication with an antenna that can transmit a signal to a destination, such as a base station. The FEM 102 may include a power amplifier module 104 and a buck converter 110. Although a single power amplifier module 104 is illustrated, in some cases, the FEM 102 may include multiple power amplifier modules.

The buck converter 110 can modify a voltage received from a power supply, such as a battery. For example, the buck converter 110 can step down the voltage received from the power supply. In some cases, the buck converter 110 may be combined with a buck boost, which can be used to step up the voltage received from the power supply. Moreover, although illustrated as a buck converter, FEM 102 may include other types of DC-DC converters instead of or in addition to the buck converter 110.

The power amplifier module 104 may include one or more power amplifiers 108 and a bypass switch 106. As used herein, power amplifiers 108 may refer to a single power amplifier or a plurality of power amplifiers. In some cases, each of the plurality of power amplifiers may be associated with a single communication network or technology. For example, the plurality of power amplifiers may each support different communication bands of a 2G communication network. In some cases, the one or more power amplifiers 108 may include a power amplifier that can support multiple communication networks. The bypass switch 106 enables the selection of different voltage supplies to be provided to the power amplifiers 108 based on the selected communication network. For example, for a 2G communication network, the bypass switch 106 may provide a battery supply to the power amplifiers 108. However, for a 3G communication network, the bypass switch 106 may provide a voltage supply received from the buck converter 110 to the power amplifiers 108. Although referred to as a switch herein, the bypass switch 106 may also be referred to as a bypass circuit and may include one or more switches.

Example Circuit Diagram of a FEM

Figure 2:
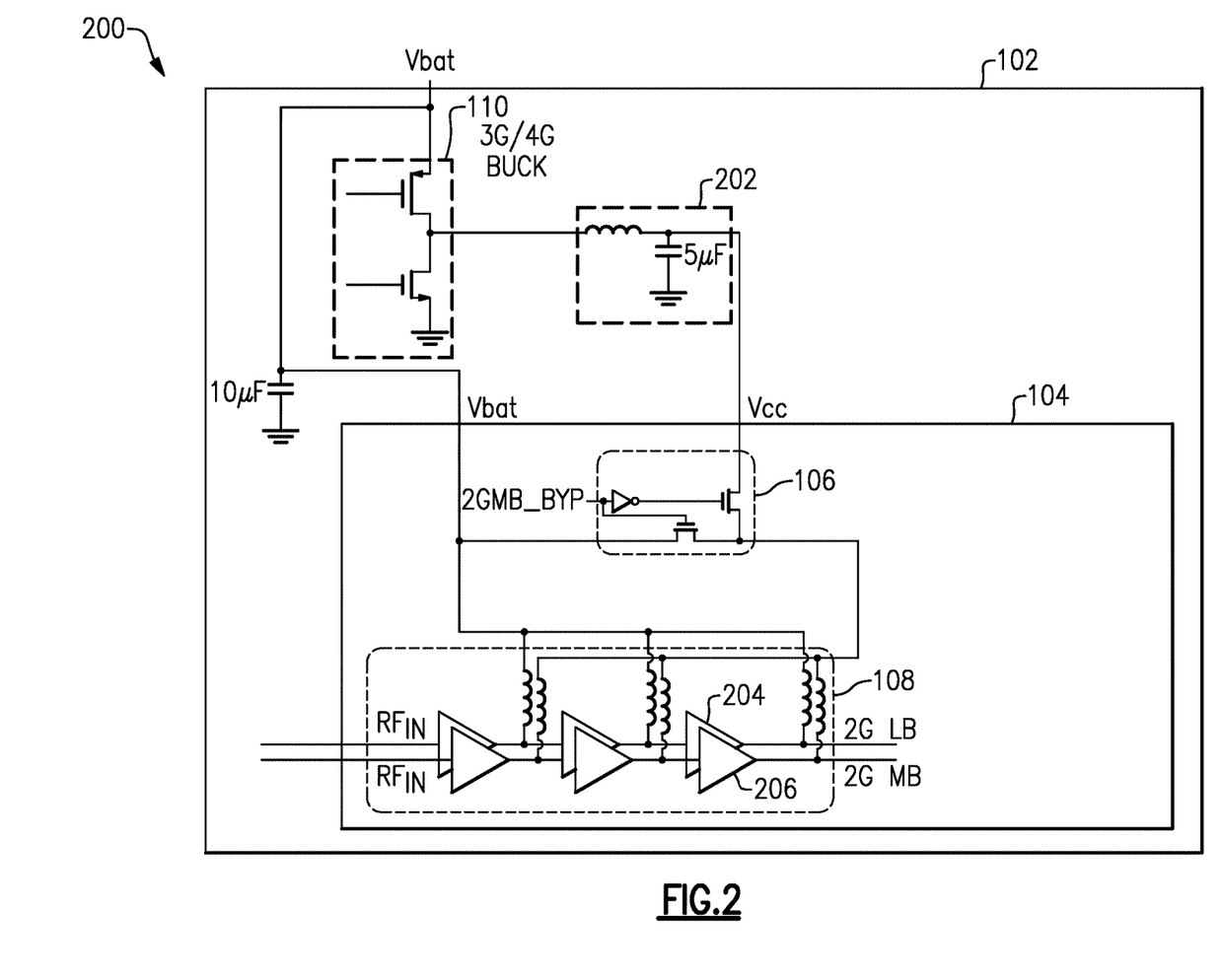
FIG. 2 illustrates a circuit diagram of an embodiment of the front-end module of FIG. 1.

FIG. 2 illustrates a circuit diagram 200 of an embodiment of the front-end module 102 of FIG. 1. As illustrated in FIG. 2, the power amplifiers 108 may include multiple power amplifiers 204, 206. However, in some embodiments, the power amplifier module 104 may include more or less power amplifiers. For example, the power amplifier module 104 may include a high band power amplifier in addition to the low band (LB) PA 204 and the mid band (MB) PA 206. Further, the power amplifiers 204 and 206 are illustrated as three stage power amplifiers. However, the power amplifiers 204 and 206 are not limited as such and may have more or fewer stages.

In the illustrated embodiment, the power amplifier 204 is a 2G low band power amplifier and receives a voltage supply from a Vbat input to the FEM 102. Further, as illustrated, the power amplifier 204 receives the voltage supply directly from the Vbat input. Although termed Vbat, it should be understood that, in certain embodiments, the voltage supplied may be received from a power source other than a battery, such as another regulator or DC-DC converter. Further, although the low band power amplifier 204 is described as a 2G low band power amplifier, it should be understood that the power amplifier may support non-2G communication bands. For example, the power amplifier 204 may support low band 4G communication.

The power amplifier 206 represents the power amplifier that is capable of supporting multiple communication networks. In other words, in some cases, the 2G mid band power amplifier 206 may be reused to support additional communication networks. For example, the power amplifier 206 may support a 2G mid-band or 2G high band communication network. Moreover, the power amplifier 206 may support non-2G communication networks, such as a 3G, 4G, or 4G LTE communication network. The power amplifier 206 receives its voltage supply via the bypass switch 106, which can control whether the power amplifier 206 receives a voltage supply from the Vbat input or from a DC-DC converter, such as the buck converter 110.

In some embodiments, the buck converter 110 may be in communication with the bypass switch 106 via an LC circuit 202. Advantageously, in certain embodiments, by using the bypass switch 106 to regulate whether the power amplifier 206 receives power from the buck converter 110 or directly from the Vbat, the size of the LC circuit 202 may be reduced compared to other power amplifier module designs that include a large buck converter without a bypass switch. Further, in certain embodiments, the use of the bypass switch 106 enables the size of the DC-DC converter (e.g., the buck converter 110) that is used to support the non-2G communication networks (e.g., 3G or 4G communication networks) to be reduced compared to systems that do not include the internal bypass switch 106 in the power amplifier module 104. Moreover, in some cases, the power amplifier module 104 is more power efficient compared to systems that do not include the bypass switch 106 to control the voltage supplied to the PA 206.

In FIG. 2, only the power amplifier 206 is connected to the bypass switch 106. The low band PA 204 is not connected to the bypass switch 106 because generally the power required for the low band PA 204 is at or near that supplied by the battery. Further, connecting the low band PA 204 to a power supply via the bypass switch 106 would require an increase in the size of the bypass switch 106. However, in certain embodiments, the bypass switch 106 can be configured to support the low band PA 204. In such cases, the low band PA 204 can be connected to a power supply via the bypass switch 106. Further, the bypass switch 106 may be expanded to support the connection to both the PAs 204 and 206.

Advantageously, in certain embodiments, by supporting the application of different power supply voltages to the power amplifier 204 or 206, the front-end module 102 can support multiple communication bands without requiring the inclusion of a power amplifier for each communication band. Further, the front-end module 102 can support multiple communication bands while optimizing the amount of power required by the power amplifier to support each communication band.

Example Bypass Switch Circuit

Figure 3A:
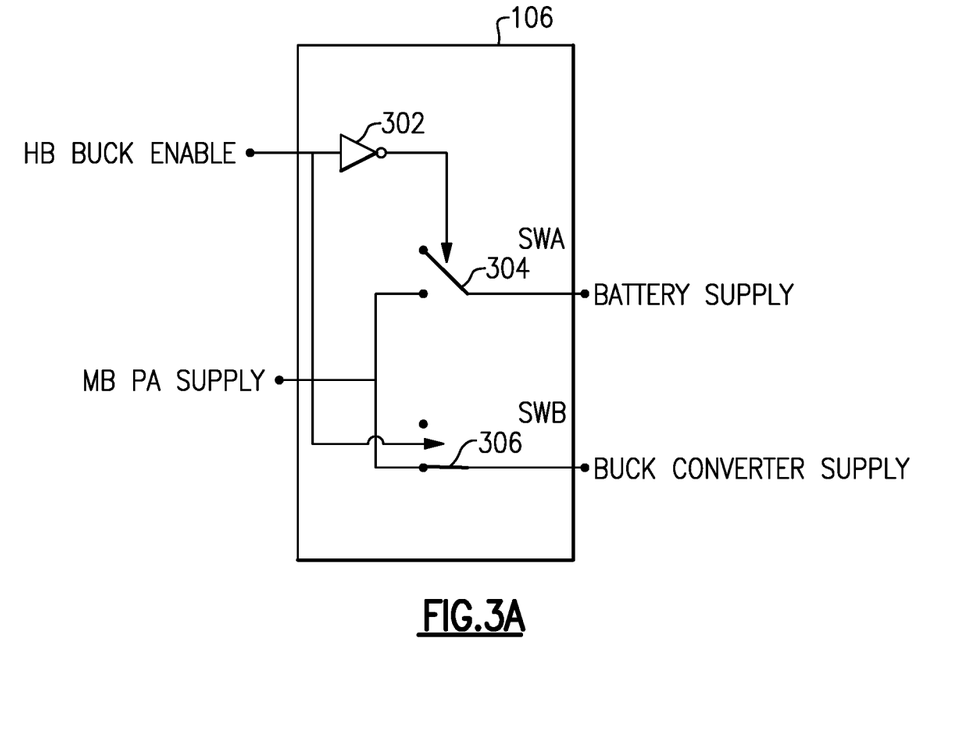
FIGS. 3A and 3B illustrate a circuit diagram of an embodiment of a bypass switch included in a power amplifier module.

FIG. 3A illustrates a circuit diagram of an embodiment of a bypass switch 106 included in a power amplifier module 104. As illustrated in FIG. 3A, the bypass switch 106 may be a switch circuit that includes a number of circuit elements, including one or more switches. The bypass switch 106 may include an inverter 302 and a pair of switches 304 and 306. The inverter 302 may be used to control the switches 304 and 306. In response to receiving a buck enable signal, the switch 304 may be opened and the switch 306 may be closed, as illustrated in FIG. 3A, resulting in the buck converter supply being provided to the power amplifier via the PA supply pin or node. Alternatively, or in addition, the switch 304 may be connected to an open load. By providing the buck converter supply to the power amplifier 108, the power amplifier can function or operate with respect to a non-2G communication network or mode, such as a 3G or 4G communication network.

Figure 3B:
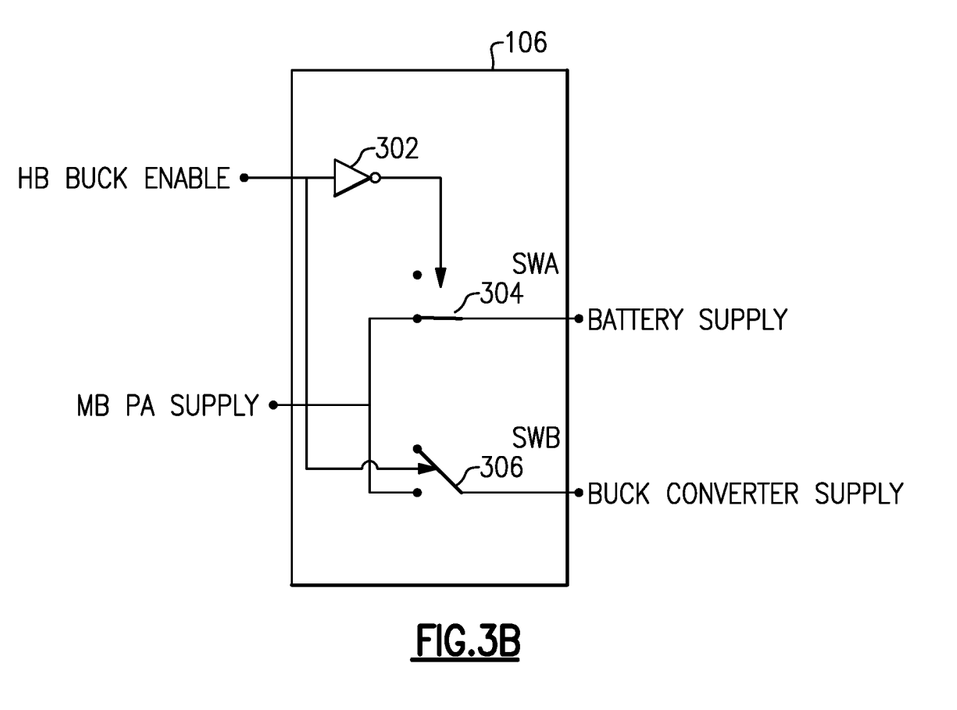

On the other hand, in response to receiving a non-buck enable signal, the switch 304 may be closed and the switch 306 may be opened, as illustrated in FIG. 3B, resulting in the battery supply being provided to the power amplifier via the PA supply node. Alternatively, or in addition, the switch 306 may be connected to an open load. By providing the battery supply to the power amplifier, the power amplifier can function in a 2G communication mode. The buck enable signal can be a logic zero or a logic one signal to indicate the operational mode of the power amplifier and, consequently, the voltage supply to be provided to the power amplifier.

As previously described, in some embodiments, both the PA 204 and the PA 206 may be in communication with the bypass switch 106. Thus, while the switches 304 and 306 may regulate power to the PA 206, the bypass switch 106 may include additional switches in a similar configuration to the switches 304 and 306 that can regulate the power supplied to the PA 204.

Figure 4:
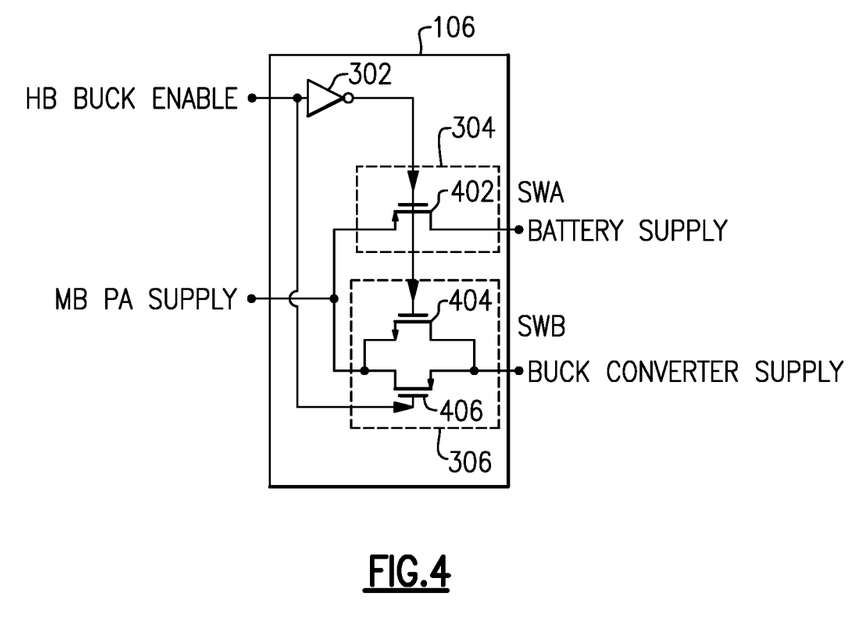
FIG. 4 illustrates a more detailed circuit diagram of an embodiment of the bypass switch of FIGS. 3A and 3B.

FIG. 4 illustrates a more detailed circuit diagram of an embodiment of the bypass switch 106 of FIG. 3A. As illustrated in FIG. 4, the switches 304 and 306 may be implemented using one or more transistors. In the illustrated example, the switch 304 is implemented using a p-channel field-effect transistor (pFET) 402. This pFET 402 is connected between the battery power supply and the voltage supply port to the PA. Further, the inverter 302 is connected to the gate of the pFET 402 and can control whether the pFET 402 passes the battery supply voltage to the supply port of the PA. The battery voltage may depend on the implementation of the wireless device. However, it is often the case that the battery voltage will vary between 3.5 and 4.5 volts.

The switch 306 may be implemented using a pair of transistors that are connected in parallel between the buck converter supply and the voltage supply port to the PA. The transistor 406 may be a pFET and the transistor 404 may be an n-channel FET (nFET). Using the transistor pair 404 and 406 enables the switch 306 to support a battery voltage from approximately 0.5 volts up to the battery voltage (e.g., between 3.5 and 4.5 volts). The combination of the nFET transistor 404 and the pFET transistor 406 enables the switch 306 to have a low impedance throughout the entire dynamic voltage range supported by the bypass switch 106. Further, similar to the switch 304, the inverter 302 is connected to the gate of the nFET 404 and, in conjunction with the buck enable signal that is provided to the gate of the pFET 406, can control whether the switch 306 passes the buck converter supply voltage to the supply port of the PA.

Simulation Result

Figure 5:
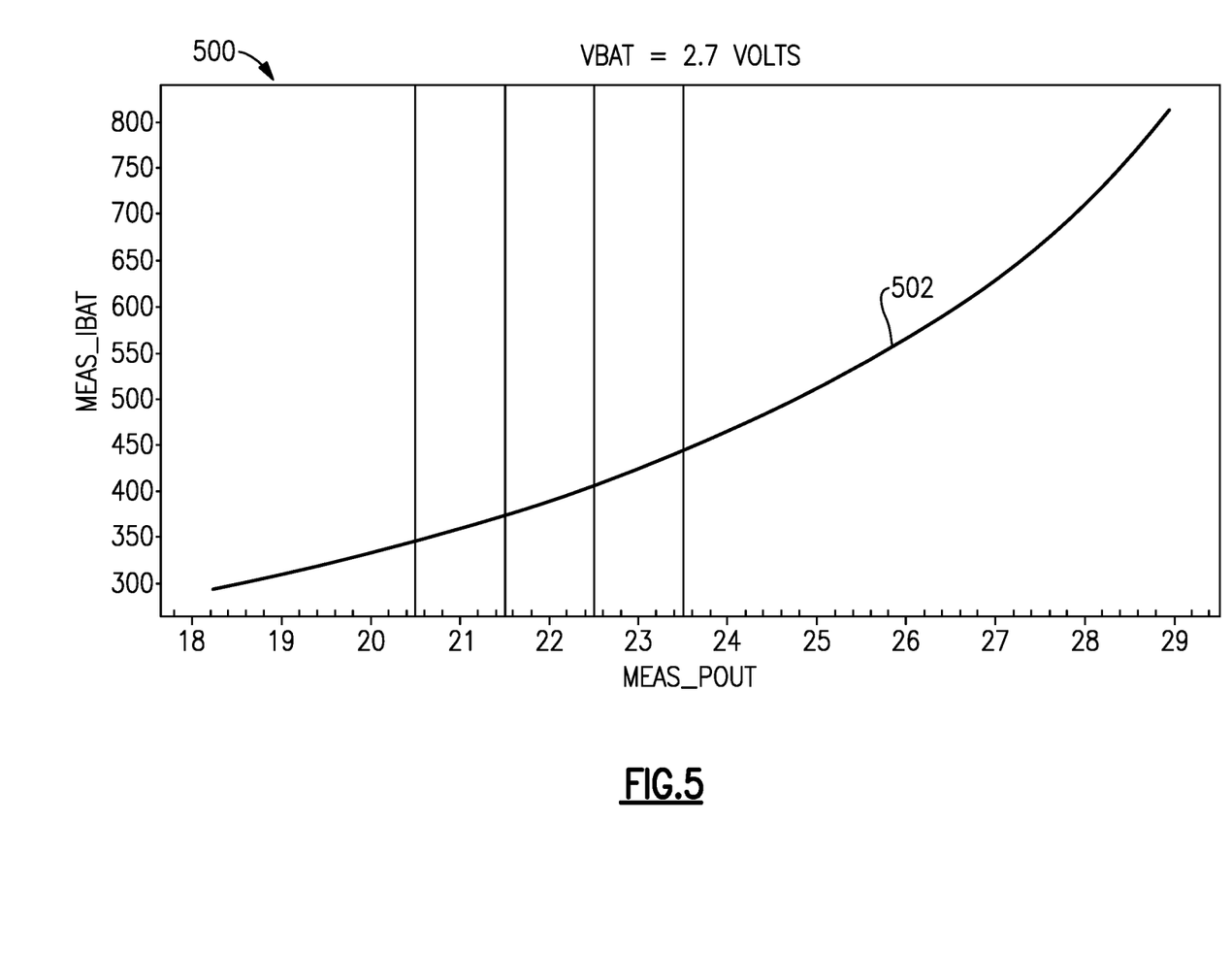
FIG. 5 illustrates a graph of the measured power and current for a 2G power amplifier with a reduced supply voltage.

FIG. 5 illustrates a graph 500 of the measured power and current for a 2G power amplifier with a reduced supply voltage as represented by the line 502. The graph 500 is the result of a simulation that illustrates the operation of a 2G power amplifier when it is used to support operation of 3G or 4G communication by using a buck converter with an assumed efficiency of 90%, which is a conservative efficiency as many DC-DC converters can have higher efficiencies. The effective current consumption can be calculated for the power amplifier using equation 1.

$$I_{BATT} = \frac{I_{PA} \times V_{PA}}{V_{BATT} \times \emptyset} \quad (1)$$

The efficiency of the DC-DC converter is represented by Ø, which as previously stated is assumed to be 90%. Further, the battery voltage, $V_{BATT}$, is set to 3.8 volts in this example and the power amplifier voltage, $V_{PA}$, is set to 2.7 volts. Thus, the current draw of the battery may be calculated as $I_{BATT}=I_{PA} \times 0.77$. Thus, we can see from this calculation that there is an overall improvement of system efficiency of 23% by operating the power amplifier using the DC-DC converter to reduce the voltage supplied to the power amplifier instead of operating at the battery voltage when the power amplifier is being used for 3G or 4G communication. Thus, in certain embodiments, the use of the bypass switch 106 to facilitate operation of a power amplifier 108 with respect to multiple communication networks can result if potential power efficiency savings of up to 23%. Referring to the graph 500, we can see from the line 502 that at 23.5 dBm, the current from the battery is measured as 444 mA.

Example Power Amplifier Configuration Process

Figure 6:
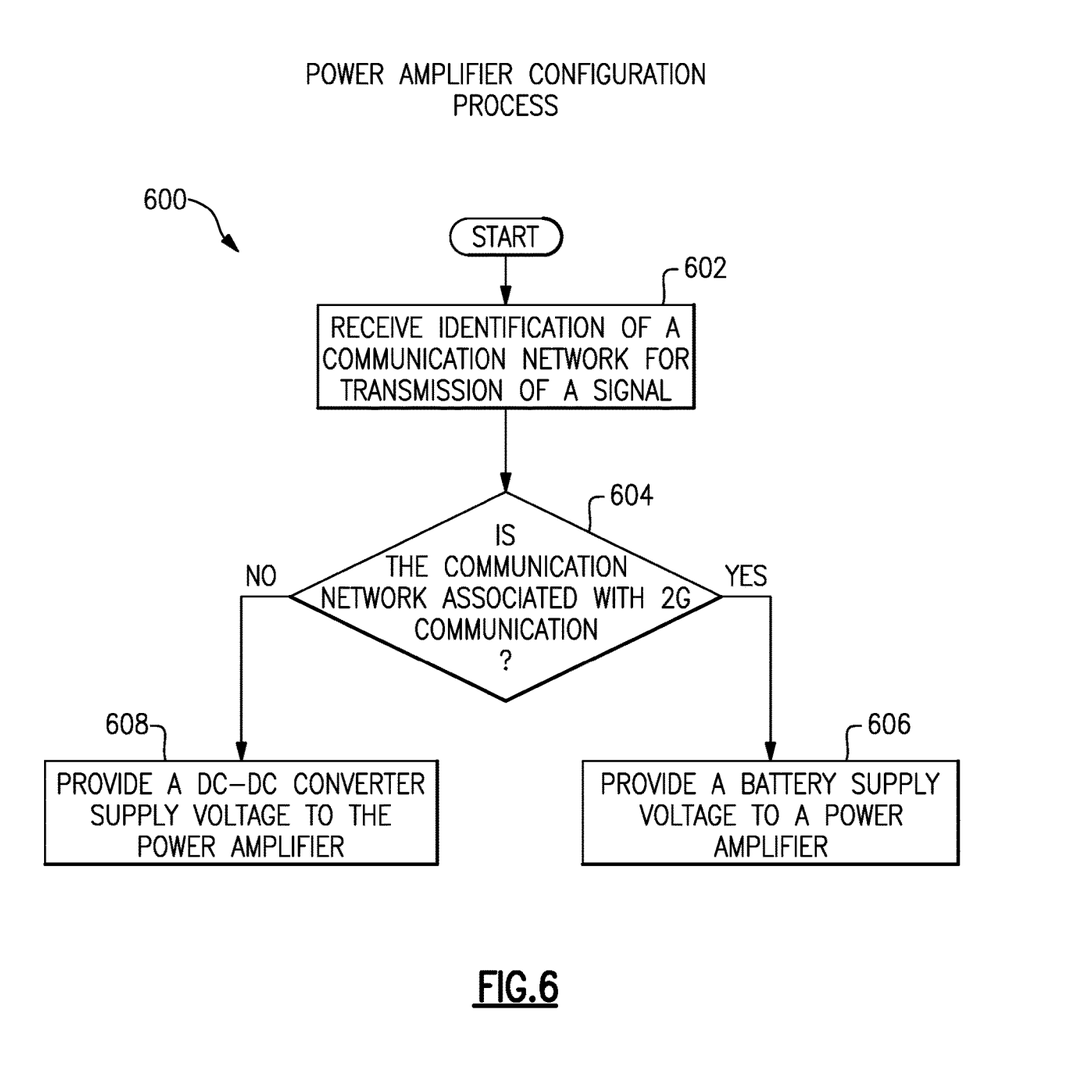
FIG. 6 presents a flowchart of an embodiment of a power amplifier configuration process.

FIG. 6 presents a flowchart of an embodiment of a power amplifier configuration process 600. The process 600 can be implemented by any system that can configure a power amplifier based, at least in part, on the communication network and/or frequency band or bands being used to communicate with another device, such as a base station. For example, the process 600 may be performed by a front-end module 102, a baseband processor, a call processor, a controller, a central processor, a power amplifier module 104, or a bypass switch 106, to name a few. Although one or more systems may implement the process 600, in whole or in part, to simplify discussion, the process 600 will be described with respect to particular systems.

The process 600 begins at the block 602 where, for example, a baseband processor of a wireless device receives an identification of a communication network for transmission of a signal. The communication network may be identified by a device, such as a base station, that is in communication with the wireless device. Further, the identification of the communication network may indicate a communication standard and/or a communication frequency with which the wireless device is to communication with the base station, or other device.

At decision block 604, the baseband processor determines whether the communication network is associated with 2G communication. This determination may be made based at least in part on the identification of the communication network at block 602. Further, the determination at the decision block 604 may include determining the communication network and/or frequency band with which the wireless device is to communicate with the base station (e.g., a 3G or 4G LTE network, etc.).

If it is determined at the decision block 604 that the wireless device is to use one or more 2G communication bands, the baseband processor causes a battery supply voltage to be supplied to the power amplifier 108 at block 606. The block 606 can include configuring the bypass switch 106 such that the power amplifier receives a voltage from the battery supply instead of from the buck converter 110, or another DC-DC converter included in the wireless device. In some embodiments, the bypass switch 106 may be configured to not provide a voltage to the power amplifier. This may occur, for example, when the communication network is determined to be a low band 2G network. The low band 2G network may be, for example, band 5, which may encompass frequencies between 824 and 915 MHz. In contrast, the mid band 2G network may band 4, which may encompass frequencies between 1710 and 1910 MHz. In cases where the communication network is determined to be a low band 2G network, the power amplifier 204, which is connected to the battery voltage supply via a separate path from the bypass switch 106, may be used during transmission.

If it is determined at the decision block 604 that the wireless device is to use a non-2G communication network, such as a 4G LTE network, the baseband processor causes a DC-DC converter supply voltage to be provided to the power amplifier 108 at block 608. Although not limited as such, a 3G or 4G network may be between 1880 and 2025 MHz. In some embodiments, the power amplifier 206 can support one or more bands between band 33 and 46. The block 608 can include configuring the DC-DC converter to provide a supply voltage of a particular voltage based at least in part on the specific communication network and/or frequency band that the wireless device is to use for communication. Further, the block 608 can include configuring the bypass switch 106 such that the power amplifier receives a voltage from the DC-DC converter instead of from the battery supply.

Example Wireless Device

Figure 7:
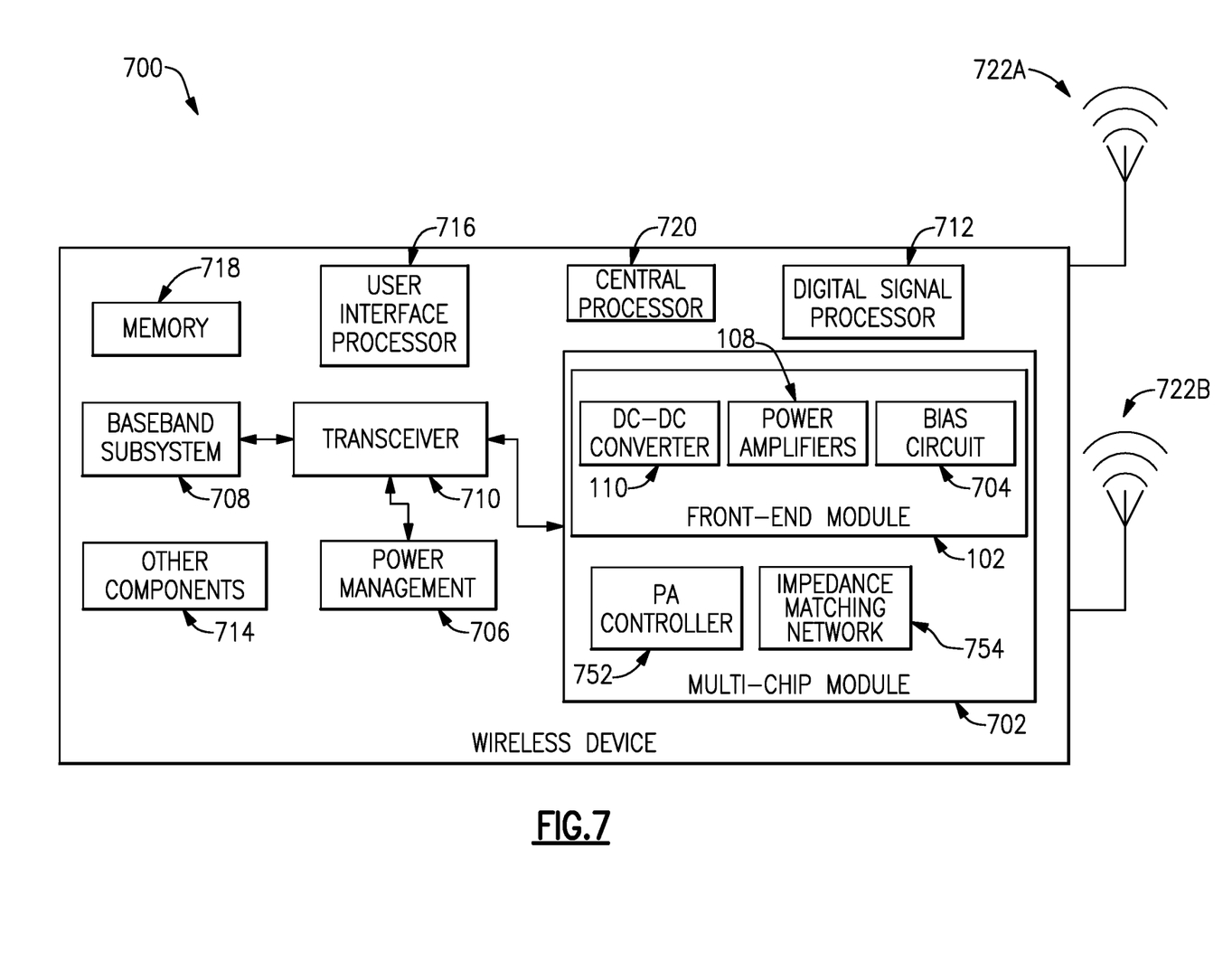
FIG. 7 illustrates a block diagram of an embodiment of a wireless device.

FIG. 7 illustrates a block diagram of an embodiment of a wireless device 700. The wireless device 700 includes a multi-chip module (MCM) 702 with a front-end module 102. This FEM 102 may include some or all of the embodiments previously described with respect to the FEM 102. In some cases, the multi-chip module 702 may include multiple FEMs. Although illustrated separately, in some implementations, the MCM 702 may be part of the transceiver 710.

In the example illustrated in FIG. 7, the FEM 102 includes a DC-DC converter 110, one or more power amplifiers 108, and a bias circuit 704. As previously described, the PAs 108 may be included as part of a power amplifier module, which may include a bypass switch. The bias circuit 704 may bias the operating range of the power amplifiers 108. In some embodiments, the bias circuit 702 is optional or omitted. As previously described, the DC-DC converter 110 may be a buck converter. However, in some embodiments, the DC-DC converter 110 may be a different type of DC-DC converter, such as a switched capacitor converter.

In addition to the FEM 102, the MCM 702 may include a number of additional systems configured to facilitate operation of the one or more PAs included in the FEM 102. For example, the MCM 702 may include a PA controller 752 and an impedance matching network 754. The PA controller 752 may be configured to adjust the configuration of one or more PAs 108. Adjusting the configuration of the PAs 108 may include configuring a bypass switch included in the FEM 102 and/or included in a power amplifier module of the FEM 102. The PA controller 752 may adjust the configuration of a PA 108 based at least in part on a control signal received from a base station. In some cases, the baseband subsystem 708 includes the PA controller 752 and/or provides a control signal to the PA controller 752 for configuring the PA 108.

The impedance matching network 754 may be configured to match one or more impedance values between one or more circuits in a load line. For instance, the impedance matching network 554 may be configured to match an impedance between the antenna 722A and the FEM 102.

In some cases, the MCM 702 can receive RF signals from a transceiver 710 that can be configured and operated in known manners to generate RF signals to be amplified and transmitted, and to process received signals. The transceiver 710 is shown to interact with a baseband subsystem 708 that is configured to provide conversion between data and/or voice signals suitable for a user and RF signals suitable for the transceiver 710. In some cases, the transceiver 710 may include the MCM 702 and/or the FEM 102.

Further, the transceiver 710 may be connected to a power management component 706 that is configured to manage power for the operation of the wireless device. Such power management can also control operations of the baseband sub-system 708 and the MCM 702. It should also be understood that the power management component 706 may include a power supply, such as a battery. Alternatively, or in addition, one or more batteries may be separate components within the wireless device 700.

Other connections between the various components of the wireless device 700 are possible, and are omitted from FIG. 7 for clarity of illustration only and not to limit the disclosure. For example, the power management component 706 may be electrically connected to the baseband subsystem 708, the MCM 702, the DSP 712, or other components 714. As a second example, the baseband subsystem 708 may be connected to a user interface processor 716 that may facilitate input and output of voice and/or data provided to and received from the user. The baseband sub-system 708 can also be connected to a memory 718 that may be configured to store data and/or instructions to facilitate the operation of the wireless device 700, and/or to provide storage of information for the user.

In addition to the aforementioned components, the wireless device 700 may include one or more central processors 720. Each central processor 720 may include one or more processor cores. Further, the wireless device 700 may include one or more antennas 722A, 722B. In some cases, one or more of the antennas of the wireless device 700 may be configured to transmit and receive at different frequencies or within different frequency ranges. Further, one or more of the antennas may be configured to work with different wireless networks. Thus, for example, the antenna 722A may be configured to transmit and receive signals over a 2G network, and the antenna 722B may be configured to transmit and receive signals over a 3G network. In some cases, the antennas 722A and 722B may both be configured to transmit and receive signals over, for example, a 2.5G network, but at different frequencies. In some cases, the antenna 722A may be a primary antenna and the antenna 722B may be a diversity antenna. Moreover, while both antennas 722A and 722B are illustrated as being on the same side of the wireless device 700, in some cases, the antennas 722A and 722B are on different sides or surfaces of the wireless device 700.

A number of other wireless device configurations can utilize one or more features described herein. For example, a wireless device may or may not perform carrier aggregation. In another example, a wireless device can include additional antennas such as diversity antenna, and additional connectivity features such as Wi-Fi, Bluetooth, and GPS. Further, the wireless device 700 may include any number of additional components, such as analog to digital converters, digital to analog converters, graphics processing units, solid state drives, etc. Moreover, the wireless device 700 can include any type of device that may communicate over one or more wireless networks and that may include a power amplifier that can be configured to support different communication networks by using, for example, a bypass switch to modify the power or voltage supplied to the power amplifier. For example, the wireless device 700 may be a cellular phone, including a smartphone or a dumbphone, a tablet, a laptop, a video game device, a wearable device (e.g., augmented reality or virtual reality glasses), a smart appliance, etc.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
a configurable power amplifier that supports communication with a plurality of communication networks across a plurality of frequency bands, the configurable power amplifier configured to process signals associated with the plurality of frequency bands based at least in part on a supply voltage provided to the configurable power amplifier; and
a bypass circuit in communication with the configurable power amplifier and configured to regulate selection of the supply voltage provided to the configurable power amplifier based at least in part on a selected communication network from the plurality of communication networks, the supply voltage selected from a plurality of possible supply voltages.

2. The power amplifier module of claim 1 wherein the bypass circuit is configured to select the supply voltage from one of a battery supply voltage or a buck-converter supply voltage.

3. The power amplifier module of claim 2 wherein the buck-converter supply voltage is combined with a buck boost to step up the supply voltage.

4. The power amplifier module of claim 1 further comprising a second power amplifier configured to process one or more different frequencies than the configurable power amplifier.

5. The power amplifier module of claim 4 wherein the second power amplifier is in communication with a battery supply voltage without being in communication with the bypass circuit.

6. The power amplifier module of claim 4 wherein the bypass circuit is in communication with the second power amplifier.

7. The power amplifier module of claim 1 wherein the bypass circuit includes a first transistor and a second transistor in communication with a buck-converter supply voltage.

8. The power amplifier module of claim 7 wherein the first transistor is a p-type transistor and the second transistor is an n-type transistor.

9. A front-end module comprising:
a power amplifier module including a configurable power amplifier that supports communication with a plurality of communication networks across a plurality of frequency bands and a bypass circuit, the configurable power amplifier configured to process a plurality of signals corresponding to the plurality of frequency bands based at least in part on a supply voltage provided to the configurable power amplifier, and the bypass circuit in communication with the configurable power amplifier and configured to regulate selection of the supply voltage provided to the configurable power amplifier based at least in part on a selected communication network from the plurality of communication networks, the supply voltage selected from a plurality of supply voltages; and
a direct current-direct current converter in communication with the power amplifier module and configured to provide at least one supply voltage from the plurality of supply voltages to the bypass circuit.

10. The front-end module of claim 9 wherein the direct current-direct current converter includes a buck converter.

11. The front-end module of claim 10 wherein the buck converter is combined with a buck boost.

12. The front-end module of claim 9 wherein the plurality of supply voltages includes a battery supply voltage or a buck-converter supply voltage.

13. The front-end module of claim 9 wherein the bypass circuit includes one or more switches.

14. The front-end module of claim 9 wherein the power amplifier module further includes a second power amplifier configured to process at least one frequency band not included in the different frequency bands supported by the configurable power amplifier.

15. The front-end module of claim 14 wherein the second power amplifier receives power from a battery supply voltage without communicating with the direct current-direct current converter.

16. A method of operating a power amplifier module, the method comprising:
receiving, by a baseband processor of a wireless device, an identification of a communication network for transmission of a signal, the communication network one of a plurality of different communication networks that support different frequency bands;
determining a type of the communication network; and
in response to determining that the type of the communication network is of a first type, configuring a bypass circuit of the wireless device to provide a supply voltage from a direct current-direct current converter to a power amplifier of the wireless device, the power amplifier supporting communication with a plurality of communication networks across a plurality of frequency bands.

17. The method of claim 16 further comprising, in response to determining that the type of the communication network is of a second type, providing a battery supply voltage to the power amplifier.

18. The method of claim 17 wherein providing the battery supply voltage to the power amplifier includes configuring the bypass circuit to provide the battery supply voltage to the power amplifier.

19. The method of claim 16 further comprising providing a battery supply voltage to a second power amplifier of the wireless device.

20. The method of claim 16 wherein the type of the communication network is determined based at least in part on one or more of a communication protocol implemented by the communication network or a frequency band supported by the communication network.

* * * * *